US006777911B2

United States Patent
Lewis et al.

(10) Patent No.: US 6,777,911 B2
(45) Date of Patent: Aug. 17, 2004

(54) CHARGE TRANSFORMER AND METHOD OF IMPLEMENTATION

(75) Inventors: Kim Michelle Lewis, Ann Arbor, MI (US); Cagliyan Kurdak, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 69 days.

(21) Appl. No.: 10/092,970

(22) Filed: Mar. 7, 2002

(65) Prior Publication Data

US 2003/0173996 A1 Sep. 18, 2003

(51) Int. Cl.[7] .............................................. H02M 3/18
(52) U.S. Cl. ...................... 320/116; 327/403; 257/236
(58) Field of Search .......................... 320/116; 327/403, 327/574; 257/236

(56) References Cited

U.S. PATENT DOCUMENTS

| 5,838,021 | A | * | 11/1998 | Ancona | ........................ 257/30 |
| 6,055,168 | A | * | 4/2000 | Kotowski et al. | ............. 363/60 |
| 6,198,645 | B1 | * | 3/2001 | Kotowski et al. | ............. 363/59 |
| 6,307,422 | B1 | * | 10/2001 | Roesner et al. | ............. 327/427 |
| 6,320,447 | B1 | * | 11/2001 | Rosner et al. | ............. 327/407 |

* cited by examiner

Primary Examiner—Bao Q. Vu
(74) Attorney, Agent, or Firm—Rader, Fishman & Grauer PLLC

(57) ABSTRACT

A charge transformer is disclosed for coupling charge from a first device to a charge sensitive device, such as a single electron transistor. The charge transformer includes a plurality of capacitors that are alternatively connected in parallel and series such that a power signal from the first device charges the capacitors when they are connected in parallel, and the capacitors are discharged to the charge sensitive device when they are connected in series.

14 Claims, 2 Drawing Sheets

CHARGE TRANSFORMER AND METHOD OF IMPLEMENTATION

FIELD OF THE INVENTION

The present invention relates generally to the field of electronics, and, more specifically, to a charge transformer used to enhance the performance of low capacitance electrometers in detector applications, such as single electron transistors.

BACKGROUND OF THE INVENTION

The discovery of the Coulomb blockade phenomena, which arises from the discreteness of electric charge, and the relatively recent advances in nanofabrication techniques, have led to the ability to make new kinds of devices that allow one to control and measure the motion of a single electron, hereinafter referred to as "charge sensitive devices." One known example of such a device is a single electron transistor (SET), which is an extremely precise solid-state electrometer. Indeed, a single electron turns an SET on or off. SETs have been used in metrological applications, as well as a tool for imaging localized individual charges in semiconductors. Further, it is likely that SETs will be used in connection with several different types of new applications, ranging from astronomy to quantum computer read-out circuitry. SETs are advantageous in many applications because of their superior charge sensitivity relative to typical commercial electrometers.

However, despite the many orders of magnitude better charge sensitivity of SETs relative to commercial electrometers, it has not been advantageous to use SETs as an electrometer when the device under test has a large relative capacitance because of excessive noise. As a result, SETs have heretofore not been used in connection with commercial macroscopic devices.

To illustrate the problem more specifically, FIG. 1 illustrates a SET amplifier circuit, which is constructed to detect an electrical current generated by a device under test 10. The device under test 10 is functionally represented in FIG. 1 as the combination of a current source $I_{Sig}$ and a capacitor $C_D$. The device under test 10 is connected to the SET such that the charge generated by the device under test determines the current flow through the SET, as known by one of the ordinary skill in the art. Thus, the charge of the device under test can be monitored via the potential at the output terminal 12. This SET circuit can be viewed as an electrometer for the device under test. Note, however, the noise performance of this circuit is far from optimum when the capacitance of the device under test is much larger than that of the SET.

Specifically, it is known that the capacitance of an SET (denoted as $C_{set}$) is constrained by the operation temperature of the SET. Therefore, assuming the SET is operated at approximately room temperature, the capacitance of the SET, $C_{set}$, is limited to a very low value, typically less than 1 aF. In contrast, the capacitance ($C_D$) of the device under test 10 is likely to be much larger than the $C_{set}$, particularly for commercial macroscopic devices. As a result, only an unacceptably small fraction of the input power from the device under test 10, given by $C_{set}/C_D$, can couple to the SET. Thus, when the capacitance $C_D$ of the device under test 10 is in the picoFarrad (pF) or nanofarrad (nF) range, the suppression factor becomes too large. As a result, charge sensitive devices, such as SET amplifiers, heretofore have not been used to measure and detect macroscopic devices.

Therefore, the inventors hereof have recognized the need for a new device for and method of implementing charge sensitive devices, such as SET amplifiers, to detect and measure electrons generated by macroscopic devices.

SUMMARY OF THE INVENTION

The present invention relates to a charge transformer having a plurality of capacitors and a plurality of switches connected between the capacitors, wherein the switches are adapted to alternatively connect the capacitors in series and in parallel. When the switches are in a first state, the capacitors are connected in parallel, and the capacitors are capable of being charged. When the switches are in a second state, the capacitors are connected in series, and the capacitors are capable of being discharged.

In certain embodiments of the invention, a charge transformer is connected between a device under test and a charge sensitive device, such as an SET. The charge transformer facilitates the coupling of charge from the device under test to the charge sensitive device. In this way, a significant portion of the power generated by the device under test is coupled to the charge sensitive device.

One of ordinary skill in the art will recognize various other advantages and configurations of the present invention.

DETAILED DESCRIPTION OF AN EMBODIMENT OF THE INVENTION

Figure 1:
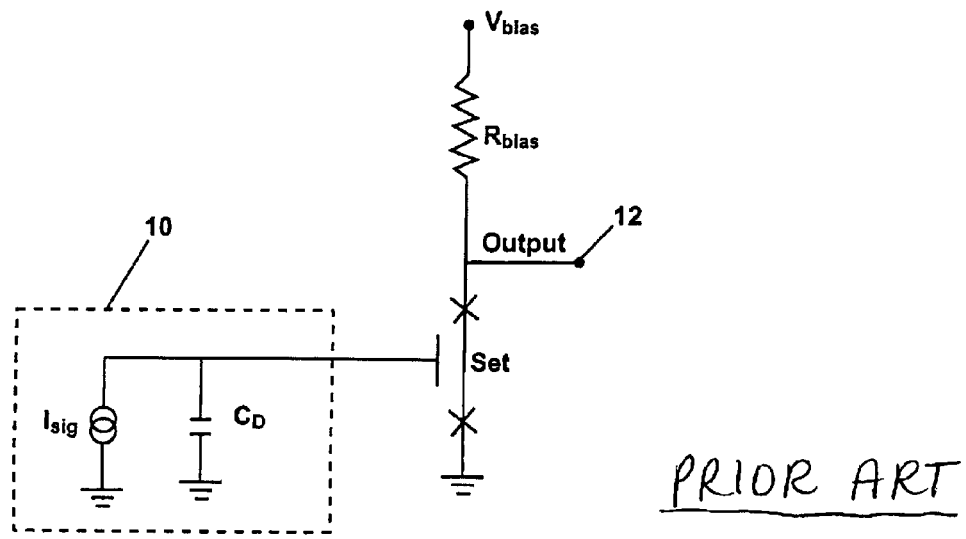
FIG. 1 is a simplified circuit diagram of a prior art SET amplifier.
Figure 2:
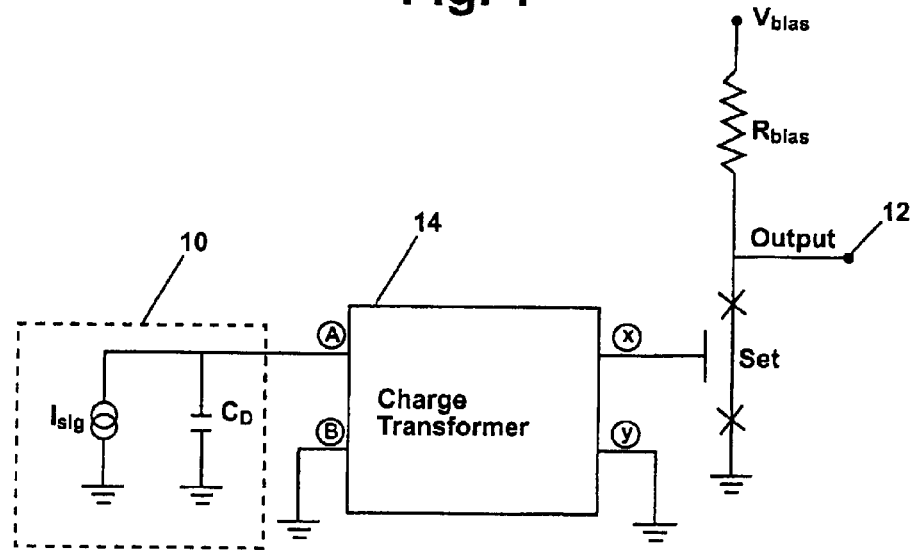
FIG. 2 is a simplified circuit diagram of an SET amplifier having a charge transformer, thereby illustrating an embodiment of the invention.

The present invention is embodied in a device, system and method that enables the use of a charge sensitive device, such as an SET, in connection with detecting and measuring electrical current produced by devices having a capacitance significantly larger than the capacitance of the charge sensitive device. FIG. 2 illustrates one embodiment of the present invention. Specifically, FIG. 2 illustrates the same basic circuit set forth in FIG. 1 with the addition of a charge transformer 14 interposed between the device under test 10 and the SET. Input terminal A of charge transformer 14 is connected to the device under test 10, and terminal B of charge transformer 14 is connected to ground. Output terminal X of charge transformer 14 is connected to the SET, and terminal Y of charge transformer 14 is connected to ground. A function of the charge transformer 14 is to effectively couple a significant portion of the input power to a charge sensitive device, such as the SET in FIG. 2. Except for the introduction of the charge transformer 14, the elements in FIG. 2 are the same as those shown in FIG. 1, and they function equivalently.

Figure 3:
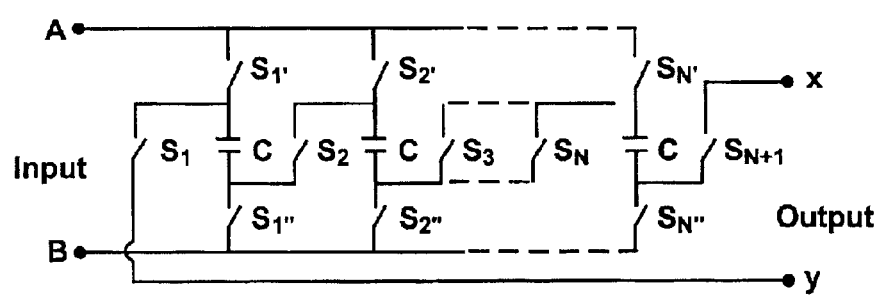
FIG. 3 is a detailed circuit diagram of a charge transformer according to an embodiment of the invention.

A preferred embodiment of the charge transformer 14 is illustrated in more detail in FIG. 3. In essence, the charger transformer 14 alternatively connects a number, N, of capacitors to the device under test 10 and to the SET through the use of a plurality of switches. When the capacitors are connected to the device under test 10, they are connected in parallel, and the power generated by the device under test 10 charges the capacitors. When the capacitors are connected to the SET, they are connected in series, and the capacitors are discharged to the SET. As a result, a significant portion of the power generated by the device under test 10 can be transferred to the SET.

Referring more specifically to FIG. 3, terminals A and B are adapted to be connected to the device under test 10 and ground, respectively. The terminals X and Y are adapted to be connected to the SET and ground, respectively. A certain number (N) of capacitors C are connected between the terminals A, B and the terminals X, Y. Preferably, all of the capacitors have the same capacitance. Further, three groupings of switches, S, S', and S", are positioned between the input terminals A, B and the output terminals X, Y. The switches are connected and arranged such that when all of the $S'_i$ and $S''_i$ are closed and all of the $S_i$ switches are open, the charge transformer capacitors $C_i$ are connected in parallel between terminal A and terminal B (terminal B being connected to ground). When the switches are in these states, capacitors $C_i$ are being charged as a result of energy being transferred from the device under test 10. On the other hand, when the $S'_i$ and $S''_i$ switches are open and switches $S_i$ are closed, the charge transformer capacitors $C_i$ are connected in series between terminal X and terminal Y (terminal Y being connected to ground). With these switch settings, capacitors $C_i$ are being discharged so that the stored energy is transferred to the SET.

An optimal number (N) of capacitors C to be used in the charge transformer 14 and the magnitude of their capacitances depend upon the capacitance, $C_D$, of the device under test 10, and the capacitance, $C_{SET}$, of the SET. Preferably, all of the capacitors $C_i$ have an equal capacitance, C, determined according to the formula: $C=\sqrt{C_D C_{SET}}$. Further, the number of capacitors in the charge transformer, N, is preferably determined according to the formula: $N=\sqrt{C_D/C_{SET}}$. Finally, the number of switches sufficient to implement this embodiment of the invention is determined according to the formula: Switches=(3N+1). For example, for one particular embodiment of the invention having four capacitors, it would be sufficient to use thirteen switches (3*4+1) to implement a charge transformer capable of switching the capacitors between parallel and series arrangements.

In operation, it is preferable that the charge capacitor switches, S, S' and S", are sufficiently fast so as to be capable of switching the capacitors, $C_i$, between their parallel state and series state more quickly than the frequency of the power signal produced by the device under test 10. The switches, S, S' and S" can be controlled by a variety of known devices (not shown in FIG. 3). In one embodiment, the switches, S, S' and S" are controlled by a dual pulse generator of the type known to those of skill in the art.

Specific embodiments of the invention can be physically implemented in a variety of known ways. For example, the invention can be implemented in the form of an integrated circuit chip fabricated using a GaAs/AlGaAs heterostructure with a high quality 2DEG. The invention can also be fabricated using other semiconductors, including using Si MOSFETs, and they can operate at high temperatures. Further, charge transformers can be integrated with an SET amplifier on the same chip.

The present invention enables the use of charge sensitive devices, such as SETs, in connection with macroscopic devices and other devices wherein the capacitance of the device is significantly larger than the capacitance of the SET. One of ordinary skill in the art will recognize various applications for the combination of charge sensitive devices, such as SETs, with a charge transformer according to the present invention.

While the present invention has been particularly shown and described with reference to the foregoing preferred and alternative embodiments, those skilled in the art will understand that many variations may be made therein without departing from the spirit and scope of the invention as defined in the following claims. This description of the invention should be understood to include all novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements. The invention is limited only by the following claims.

This invention was made with government support under Grant #DMR0092726 awarded by the National Science Foundation. The government has certain rights in the invention.

What is claimed is:

1. A system, comprising:
   a charge sensitive device; and
   a charge transformer adapted to be coupled between said charge sensitive device and a device under test;
   wherein said charge sensitive device is a single electron transistor.

2. The system of claim 1, wherein said device under test supplies an input power, and said charge transformer is adapted to couple at least approximately half of said input power to said charge sensitive device.

3. The system of claim 1, wherein said device under test has a capacitance that is greater than a capacitance of said charge sensitive device.

4. The system of claim 1, wherein said device under test supplies an input power having a first frequency, and said switches are adapted to alternatively connect said capacitors in parallel and series at a second frequency that exceeds said first frequency.

5. The system of claim 1, wherein said charge transformer comprises:
   a plurality of capacitors; and
   a plurality of switches connected between said capacitors, said switches being adapted to alternatively connect said capacitors in series and in parallel.

6. The system of claim 5, wherein said charge transformer further comprises an input terminal, and wherein said switches are adapted to connect said capacitors in parallel between said input terminal and ground.

7. The system of claim 5, wherein said charge transformer further comprises an output terminal, and wherein said switches are adapted to connect said capacitors in series between said output terminal and ground.

8. The system of claim 5, wherein:

said device under test has a capacitance, $C_D$;

said charge sensitive device has a capacitance, $C_{CSD}$; and said charge transformer has a number, N, of capacitors, wherein N is determined by the square root of the product of $C_D$ and $C_{CSD}$.

9. The system of claim 5, wherein:

said device under test has a capacitance, $C_D$;

said charge sensitive device has a capacitance, $C_{CSD}$; and said charge transformer capacitors each have a capacitance, C, wherein C is determined by the square root of the quotient of $C_D$ divided by $C_{CSD}$.

10. A method of coupling charge from a first device to a charge sensitive device, comprising:

charging a plurality of capacitors from a power signal provided by the first device; and discharging said capacitors to the charge sensitive device;

wherein said charge sensitive device is a single electron transistor.

11. The method of claim 10, further comprising the step of alternatively repeating said charging step and said discharging step at a frequency greater than a frequency of said power signal.

12. The method of claim 10, wherein said charging step comprises connecting said capacitors in parallel.

13. The method of claim 10, wherein said discharging step comprises connecting said capacitors in series.

14. The method of claim 10, further comprising the step of providing a plurality of switches adapted to alternatively connect said capacitors in parallel and series.

* * * * *